United States Patent
Nakase

[11] Patent Number: 6,118,658
[45] Date of Patent: Sep. 12, 2000

[54] HEAT SINK FAN FOR COOLING AN ELECTRONIC APPARATUS

[75] Inventor: Mitsunobu Nakase, Yonago, Japan

[73] Assignee: Nidec Corporation, Kyoto, Japan

[21] Appl. No.: 09/338,447

[22] Filed: Jun. 22, 1999

[30] Foreign Application Priority Data

Jun. 24, 1998 [JP] Japan ................................. 10-177536

[51] Int. Cl.[7] .................................................... H05K 7/20
[52] U.S. Cl. ......................... 361/697; 361/690; 361/694;
361/695; 257/721; 257/722; 174/15.1; 174/16.1;
174/16.3; 165/80.3; 165/104.34
[58] Field of Search ..................................... 361/690, 694,
361/695, 697, 702, 703; 257/718, 719,
721, 722; 174/16.1, 16.3; 165/80.3, 104.34;
415/176–178

[56] References Cited

U.S. PATENT DOCUMENTS

| | | | |
|---|---|---|---|
| 5,288,203 | 2/1994 | Thomas . | |
| 5,299,632 | 4/1994 | Lee . | |
| 5,309,983 | 5/1994 | Bailey . | |
| 5,335,722 | 8/1994 | Wu . | |
| 5,452,181 | 9/1995 | Hoover . | |
| 5,484,013 | 1/1996 | Morikawa et al. . | |
| 5,484,262 | 1/1996 | Thomas et al. | 415/178 |
| 5,504,650 | 4/1996 | Katsui et al. | 361/697 |
| 5,522,700 | 6/1996 | Hong | 415/177 |
| 5,526,875 | 6/1996 | Lin . | |
| 5,584,339 | 12/1996 | Hong | 165/80.3 |
| 5,615,998 | 4/1997 | Kodama et al. | 415/177 |
| 5,629,834 | 5/1997 | Kodama et al. | 361/695 |
| 5,650,912 | 7/1997 | Katsui et al. . | |
| 5,689,404 | 11/1997 | Katsui | 361/697 |
| 5,699,854 | 12/1997 | Hong . | |
| 5,701,951 | 12/1997 | Jean . | |
| 5,704,419 | 1/1998 | Agonafer et al. . | |
| 5,787,971 | 8/1998 | Dodson | 165/121 |
| 5,828,551 | 11/1998 | Hoshino et al. | 361/697 |
| 5,844,313 | 12/1998 | Hoffman . | |
| 5,896,917 | 4/1999 | Lemont et al. | 165/80.3 |
| 5,910,694 | 6/1999 | Yokozawa et al. | 310/89 |
| 5,957,659 | 9/1999 | Amou et al. . | |

*Primary Examiner*—Gerald Tolin
*Assistant Examiner*—Boris Chervinsky
*Attorney, Agent, or Firm*—McCormick, Paulding & Huber LLP

[57] ABSTRACT

A heat sink fan of the present invention comprises a heat sink including a base plate having a plurality of radiation fins, a housing coupled to the heat sink to cover the top of the heat sink and a fan motor having a rotor including a plurality of fan blades. The housing has a central opening formed for sucking ambient air by rotation of the fan motor. A cylindrical venturi case extends downwardly from the housing central opening to surround the outer periphery of the fan blades. The radiation fins form a circular recessed portion at a central portion of the base plate to accommodate the venturi case and the fan motor. The base plate is formed with tapered sections inclined from the central portion toward end portions of the base plate whereby a space defined between the housing and the base plate gradually increases toward the end portions of the base plate.

3 Claims, 2 Drawing Sheets

HEAT SINK FAN FOR COOLING AN ELECTRONIC APPARATUS

BACKGROUND OF THE INVENTION

1. Field of the Invention

The present invention relates to a heat sink fan for cooling a heat generating device such as an electric device, and more particularly, relates to a heat sink fan for cooling an electronic device such as a semiconductor device, for example, a CPU (central processing unit) or a microprocessor and an electronic circuit or the like.

2. Description of the Related Art

Heat sink fans have been used for cooling an electric device such as a CPU or the like which generates heat during the operation. The heat sink fan includes a heat sink made of heat conductive material such as aluminum or the like and having a plurality of radiation fins and a housing attached to the heat sink so as to cover the upper portion of it and form an opening communicating between an interior of the housing and the outside air. A fan motor having a rotor on which a plurality of fan blades are formed, is disposed within the housing. The heat sink is attached to the electric device with one of its surfaces being in close contact with the device.

When the fan motor having a plurality of fan blades rotates, outside air is sucked into the housing through the opening of the housing and passes by the respective radiation fins of the heat sink. The heat is conducted from the electric device to the heat sink and is radiated by the outside air passing by the respective radiation fins to suppress temperature rise in the electric device.

However, as the electric device such as semiconductor devices, a CPU, a microprocessor and an electronic circuit or the like, is improved in performance, for example, in operating speed, processing speed or the like, the amount of heat generated by the electric device increases so that the conventional heat sink does not work sufficiently. If the electric device is not cooled sufficiently, its temperature rises, resulting in not only deterioration in performance but also damage to the electric device. To be adapted for such electric device of improved performance, the heat sink fan must be improved in heat radiation efficiency to cool the electric device sufficiently.

The radiation efficiency of the heat sink fan depends upon the material of the heat sink and the capacity of the fan motor. However, if the rotational speed of the fan motor is increased to increase the capacity of the fan motor, there arises a new problem that the noise generated by the fan motor and the electric power consumption for rotating the fan motor are increased.

The heat sink is generally made of aluminum or aluminum alloy. This is because aluminum or aluminum alloy have a good heat conductivity and is excellent in workability and cost. Accordingly, it is difficult to greatly improve the cooling performance of the heat sink fan by using other material without reducing the workability and the cost.

SUMMARY OF THE INVENTION

An object of the present invention is to provide a heat sink fan having an improved cooling efficiency.

Another object of the present invention is to provide a heat sink fan having a high cooling efficiency while it generates noise at low level and requires a small amount of electric energy.

Still another object of the present invention is to provide a heat sink fan having a large heat radiation surface while retaining a low profile.

A further object of the present invention is to provide a heat sink fan with improved cooling efficiency and which absorbs a large amount of heat generated by an electric device.

A still further object of the present invention is to provide a heat sink fan which may be used for cooling an electric device having a rectangular configuration.

A heat sink fan of the present invention comprises a heat sink including a base plate having an upper surface, on which a plurality of radiation fins are formed in a row and a lower surface which is attached to an electric device; a housing coupled with the heat sink to cover the upper side of the heat sink; and a fan motor having a rotor formed with a plurality of fan blades. The housing has an opening formed at a central portion for sucking in outside air by the rotation of the fan motor. A cylindrical venturi case surrounds the outer periphery of the fan blades. The radiation fins are arranged in parallel with each other at predetermined intervals and lengths, and the radiation fins are arranged to form a circular recessed portion at a central portion of the base plate for accommodating the fan motor and the cylindrical venturi case. The base plate has tapered sections inclined downwardly from the central portion toward the ends of the base plate so as to increase a space defined between the housing and the base plate. The heat sink and the housing define ports to exhaust the air sucked into the housing through the central opening.

The cylindrical venturi case guides the ambient air sucked through the opening directly to the base plate of the heat sink without dispersion in a peripheral direction. Since the fan motor is disposed at a position confronting the central portion of the heat sink where it is heated to the highest temperature, the heat sink is effectively cooled by the air supplied directly to that portion.

Because the fan motor and the cylindrical venturi case are accommodated within the circular recess formed among the radiation fins, the heat sink has higher radiation fins, as compared with that of the radiation fins of a heat sink fan having the same height as that of the heat sink fan of the present invention. Since the heat radiating surface and/or dimension of the heat sink is large, the cooling efficiency of the heat sink fan is improved. Further, since the base plate has the tapered sections formed downwardly toward the ends of the radiation fins, the area and/or dimension of the radiating surface of the base plate is large. At the same time, since the portion of the base plate which confronts the central portion of the heating member which is heated to the highest temperature has the largest wall thickness, the thermal capacity of that portion is large and thus the efficiency of heat transmission from the heating member to the base plate is high. Finally, the space defined between the housing and the base plate is increased toward the exhaust ports. Therefore, the air sucked into the housing is smoothly exhausted whereby the cooling efficiency of the heat sink fan is further improved.

These and another objects, features, aspects and advantages of the present invention will become apparent to those skilled in the art from the following detailed description, which, taken in conjunction with the annexed drawings, discloses a preferred embodiment of the present invention.

DESCRIPTION OF THE PREFERRED EMBODIMENT

Figure 1:
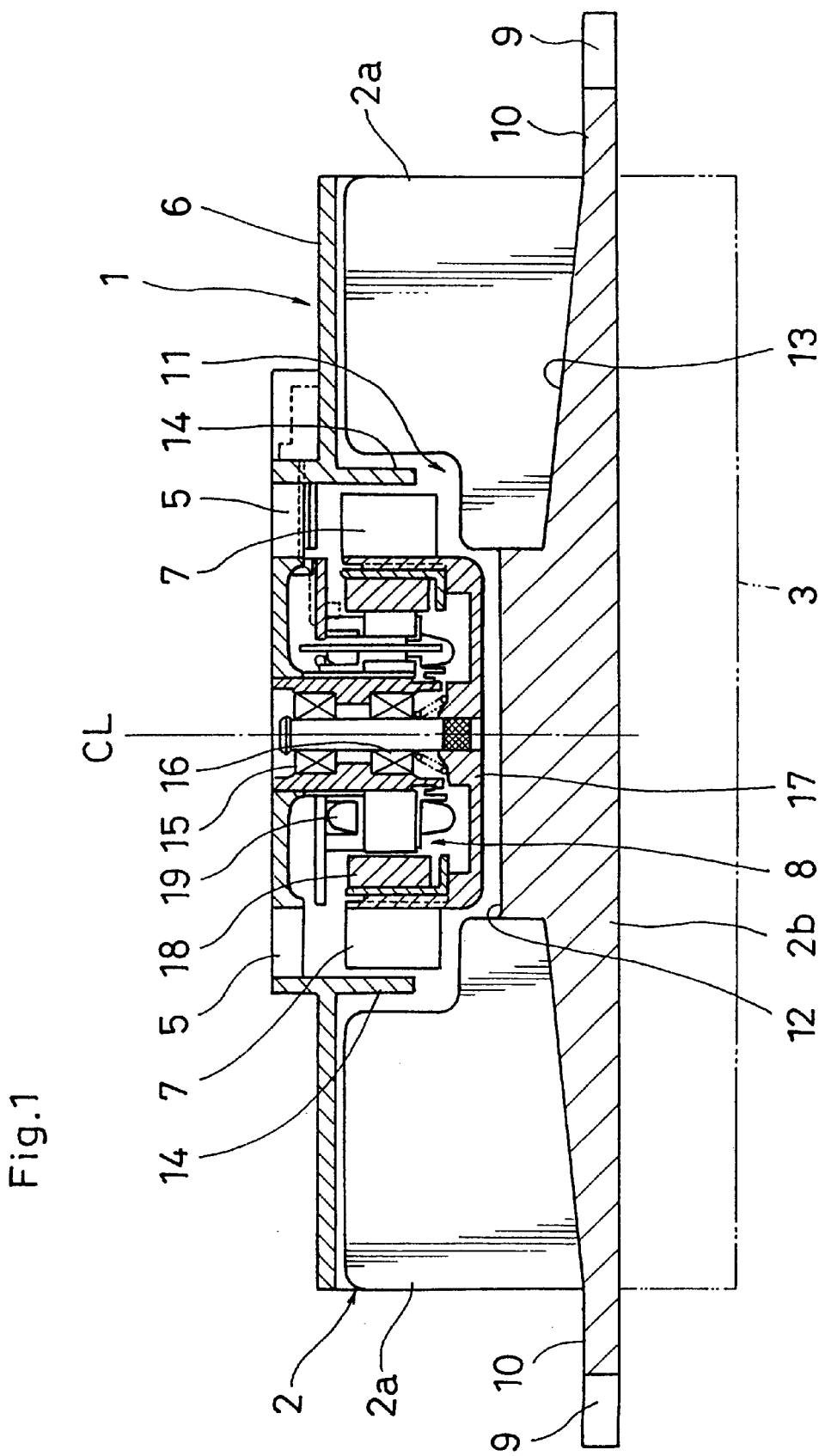
FIG. 1 is a longitudinal cross-sectional view showing a heat sink fan of the present invention.
Figure 2A:
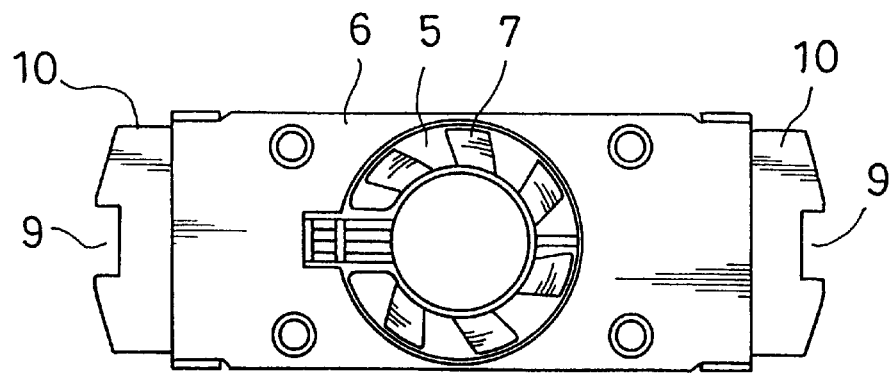
FIG. 2A is a top plan view of the heat sink fan shown in FIG. 1.
Figure 2B:
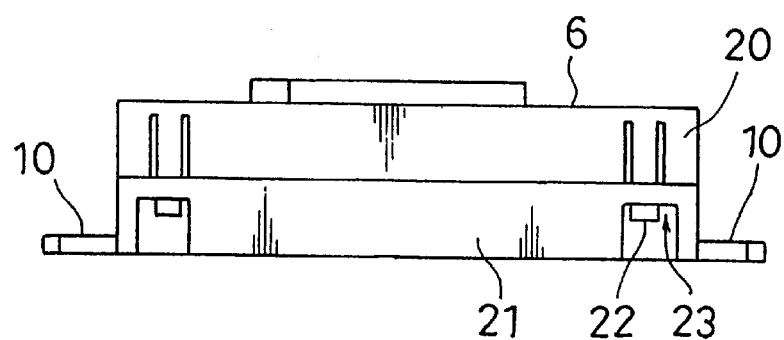
FIG. 2B is a front elevational view of the heat sink fan shown in FIG. 1.
Figure 2D:
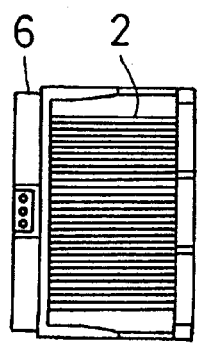
FIG. 2D is a side elevational view of the heat sink fan shown in FIG. 1.
Figure 2C:
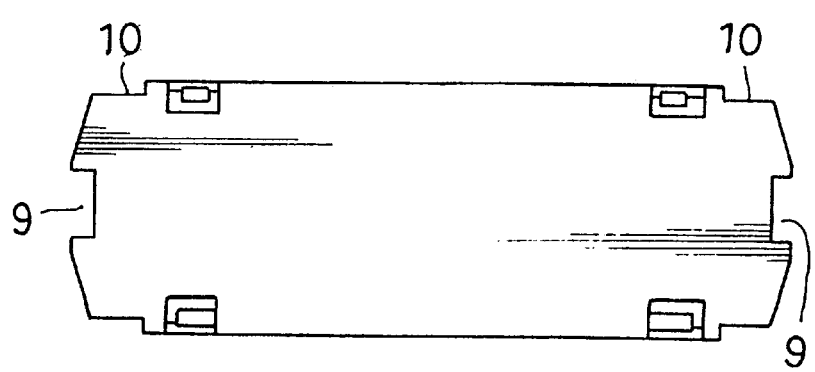
FIG. 2C is a bottom plan view of the heat sink fan shown in FIG. 1.

An embodiment of a heat sink fan of the present invention will be described below.

Referring to FIG. 1 and FIGS. 2A, 2B, 2C and 2D, a heat sink fan 1 comprises a heat sink 2 having an upper surface, on which a plurality of radiation fins 2a are formed in a row. A lower surface is attached to an electric device 3 such as a semiconductor device, for example, a CPU, a microprocessor or the like and an electronic device circuit or the like. Housing 6, coupled with the heat sink 2, and covers the upper side of the heat sink 2 and a fan motor 8 has a rotor which is formed with a plurality of fan blades 7. The housing 6 has an opening 5 formed at a central portion. Ambient air is sucked inwardly through the opening 5 by the fan blades 7 driven by the motor 8 which, in turn, generates an air flow to the radiation fins 2a by the rotation of the rotor and blades.

The lower surface of base plate 2b is attached to the electric device 3 by an adhesive, optionally, a pressure sensitive adhesive double coated tape or the like. It is preferable that the base plate 2b is closely attached to the electronic device 3 so that heat generated by the electronic apparatus 3 can be directly and easily conducted to the base plate 2b.

The base plate 2b has a planar shape corresponding to the shape of the electronic apparatus 3 which is to be attached to the lower surface of the base plate 2b. The heat sink fan 1, according to the present invention, is used for cooling an electronic device 3 having a rectangular planar configuration. The radiation fins 2a are arranged in parallel with each other at predetermined intervals and extended in the longitudinal direction of the rectangular shape of the device 3 on both sides of a portion where the fan motor 8 is accommodated. The base plate 2b extends beyond the ends of the radiation fins 2a on both sides so that it is larger than the electronic apparatus 3. The extended portions of the base plate 2b are formed as flange sections 10 each having a mounting cutout 9 through which the base plate 2b is fixed to the electric device 3. Further, the radiation fins 2a are arranged to form a circular recess 11 among them. The recess 11 has a diameter slightly larger than the outer diameter of the fan motor 8 for accommodating the latter. The central portion 12 of the upper surface of the base plate 2b serves as the bottom of the recess 11 and is flat. On both sides of the central portion 12 with respect to the longer sides of the rectangle, the base plate 2b is formed with tapered sections 13 which incline downwardly in the longitudinal direction of the base plate 2b. Therefore, the base plate 2b is thicker toward the central portion 12 and thinner toward the end portions.

Further, the housing 6 is provided with a venturi case 14 which is disposed around the outer periphery of the fan blades 7 to regulate air so that it flows downwardly toward the upper surface of the base plate 2b. The venturi case 14 is composed of a cylindrical outer peripheral wall which extends from the periphery of the housing defining the opening 5 through which ambient air is taken in. The height or extension of the venturi case 14 is determined such that approximately half the height of the fan blades 7 is accommodated therein. However, as the height of the venturi case 14 is increased, the air flow induced by the fan blades 7 moves linearly downwardly toward the upper surface of the base plate 2b. To the contrary, as the height of the venturi case 14 is decreased, the air flow is dispersed to both sides of the base plate 2b in the longitudinal direction. In the present embodiment, the height of the venturi case 14 is determined such that about one fourth the axial height of the fan blades 7 projects below the cylindrical venturi case 14. As a result, the cooling air flows linearly downwardly and cools the highest temperature portion of the base plate 2b (that portion near the central portion of the electric device 3) and thereafter flows more smoothly through the radiation fins 2a located on both sides of the base plate 2b in the longitudinal direction. The venturi case 14 is also accommodated within the recess 11 together with the fan motor 8.

Both end portions in the longitudinal direction of the heat sink 2 and the housing 6 define ports for exhausting the cooling air sucked into the housing 6 through the opening 5. As mentioned above, the base plate 2b has the tapered sections 13 inclined downwardly toward the exhaust ports. Therefore, spaces defined between the housing 6 and the tapered sections 13 increases toward the longitudinal end portions and the cooling air is exhausted smoothly and the cooling efficiency of the heat sink fan improved.

The fan motor 8 is provided with a cup-shaped rotor 17 which rotates around an axial center CL, and which is supported by a pair of bearings 15 and 16. The fan blades 7 are formed around the outer peripheral surface of the rotor 17 at prescribed intervals to generate the air flow. A cylindrical rotor magnet 18 is attached to the inner peripheral surface of the wall of the rotor 17, and a stator 19 is disposed to confront the rotor magnet 18 radially. When current is supplied to the stator 19, the fan blades 7 start rotation together with the rotor 17 as caused by the magnetic force interaction between the stator 19 and the rotor magnet 18.

The fan blades 7 and the fan motor 8 are deeply accommodated in the recess 11 formed among the radiation fins 2a of the heat sink 2 and the groups of radiation fins 2a are formed to surround the fan motor 8 and the fan blades 7 as shown in FIG. 1. As a result, and as compared with a conventional heat sink fan having the same height as that of the heat sink fan 1, even if the wall thickness of the base plate 2b is large at its central portion, the space between the upper surface of the base plate and the housing 6 can be relatively high with the fan motor 8 and the fan blades 7 being accommodated in the recess 11. Accordingly, the height of the radiation fins 2a can be correspondingly increased. Further, as the thickness of the base plate 2b is greatest at its central portion which corresponds to of the central portion of the electric device 3 where temperature is the highest, the heat capacity of the base plate 2b is greatest at that portion. Thus, the heat generated by the electric device 3 is efficiently absorbed at the thick central portion of the base plate 2b. In addition, since the upper surface of the base plate 2b has the tapered sections 13 on both sides of the central portion 12, the heat dissipating areas and/or the dimensions of the upper surface of the base plate 2b and the radiation fins 2a are large. As a result, the heat transferred and conducted from the electronic device 3 to the heat sink 2 can be effectively radiated through the cooling air which flows between the respective radiation fins 2a.

The housing 6 can be coupled to the heat sink 2 in a simple operation by engaging claws 22 formed on the side walls 20 of the heat sink 2 with the holes 23 formed on the side walls 21 of the housing 6 after the fan motor 8 is located in the recess 11.

As mentioned, the heat sink fan 1 of the present invention generates cooling air by sucking ambient air into the housing 6 through the opening 5 by rotation of the fan blades 7. The cooling air is then directly supplied to the central portion of the base plate 2b which is heated to the highest temperature by the heat generated by the electronic device 3, and to the radiation fins 2a located at the central portion and cools these portions while the cooling air is prevented from dispersing in a peripheral direction by the venturi case 14 which is formed adjacent the outer periphery of the fan blades 7. Thereafter, the air cools the respective radiation fins 2a by passing therebetween in the longitudinal direction of the base plate 2b, and then is exhausted from the wide exhaust holes located on both sides of the radiation fins 2a.

At that time, the heat generated by the electronic device 3 is absorbed efficiently at the central portion 12 of the base plate 2b having the greatest thickness and transmitted to both ends of the radiation fins 2a where the temperature is low. Accordingly, the central portion 12 of the base plate 2b is cooled, whereby the electronic device 3 is protected against deterioration and damage.

As described above, the fan motor 8 and the fan blades 7 are accommodated in the deep recess 11 formed among the radiation fins 2a of the heat sink 2. Therefore, the height of the radiation fins 2a can be increased by the dimension saved by accommodation of the fan motor 8 and the fan blades 7 in the recess 11. This is to be compared with the height of radiation fins of a heat sink fan having the same height as that of the heat sink fan 1. The radiating area of the fins 2a can thus be quite large. Further, since the wall thickness of the base plate 2b increases toward its central portion, the thermal capacity of the base plate 2b for absorbing heat generated by the electronic device 3 can be large at the central portion. Furthermore, because the tapered sections 13 are formed at both sides of the central portion 12 in the longitudinal direction on the upper surface of the base plate 2b and the groups of radiation fins 2a are formed on the tapered portion 13, the radiating area and/or dimension of the heat sink 2 can be increased. In addition, since the spaces defined between the housing 6 and the tapered sections are increased toward the exhaust, cooling air is smoothly exhausted and the cooling efficiency of the heat sink fan 1 is improved.

The foregoing description of the embodiments according to the present invention is provided for illustration only, and not for the purpose of limiting the invention as defined by the appended claims and their equivalents.

What is claimed is:

1. A heat sink fan for cooling an electronic apparatus comprising:

a heat sink including a base plate which has a rectangular planar shape;

a plurality of heat radiating fins formed in parallel with each other at intervals on one surface of the base plate and extending in the longitudinal direction of the base plate;

a housing coupled to the heat sink to cover the upper portion of the heat radiating fins and having a circular opening at a central portion thereof communicating between ambient air and the interior of the housing;

a fan motor having a plurality of fan blades and mounted in the housing to suck the air through the opening; and a cylindrical venturi case formed around the peripheral edge of the opening and extending to surround the fan motor;

the heat radiating fins forming a circular recess at a central portion of the base plate for accommodating the venturi case and the fan motor;

the base plate of the heat sink having a tapered section inclining downward from the outer peripheral portion of the circular recessed portion toward an end portion of the base plate;

the venturi case being arranged to guide the air to flow toward the central portion of the base plate, the height of the venturi case being established such that at least one fourth of the axial height of the fan blades projects beyond the venturi case, and a part of the fan blades being exposed between the tapered portion of the base plate and a tip of the venturi case such that the air sucked by the fan motor linearly flows to the central portion of the base plate and then flows to the radiation fins located on both sides of the central portion of the base plate in the longitudinal direction.

2. The heat sink fan according to claim 1, wherein the heat radiating fins are formed on the tapered section with the height of the heat radiating fins gradually increasing toward the end portion of the base plate.

3. A heat sink fan according to claim 1, wherein both end portions in the longitudinal direction of the heat sink and the housing define ports for exhausting air sucked into the housing through the opening.

* * * * *